United States Patent [19]

Tomita

[11] Patent Number: 5,120,591

[45] Date of Patent: Jun. 9, 1992

[54] CONDUCTIVE PATTERN BOARD AND METHOD FOR PRODUCING THE SAME

[75] Inventor: Satoru Tomita, Yokohama, Japan

[73] Assignee: Ricoh Company, Ltd., Tokyo, Japan

[21] Appl. No.: 495,609

[22] Filed: Mar. 19, 1990

[30] Foreign Application Priority Data

Mar. 29, 1989 [JP] Japan ................. 1-77734

[51] Int. Cl.⁵ .............................................. B32B 9/00
[52] U.S. Cl. .................................. 428/138; 428/209; 428/409; 428/901
[58] Field of Search ............... 428/901, 138, 209, 131, 428/409

[56] References Cited

U.S. PATENT DOCUMENTS 4,248,948 2/1981 Matsuda .............................. 428/209
4,680,226 7/1987 Takeda ................................ 428/901

Primary Examiner—Patrick J. Ryan
Assistant Examiner—Cathy K. Lee
Attorney, Agent, or Firm—Oblon, Spivak, McClelland, Maier & Neustadt

[57] ABSTRACT

A conductive pattern board that comprises an electric insulation member and a plurality of electric conductive patterns. The patterns are formed on the insulation member. A recess is formed on the insulation member and between every two adjacent patterns.

11 Claims, 10 Drawing Sheets

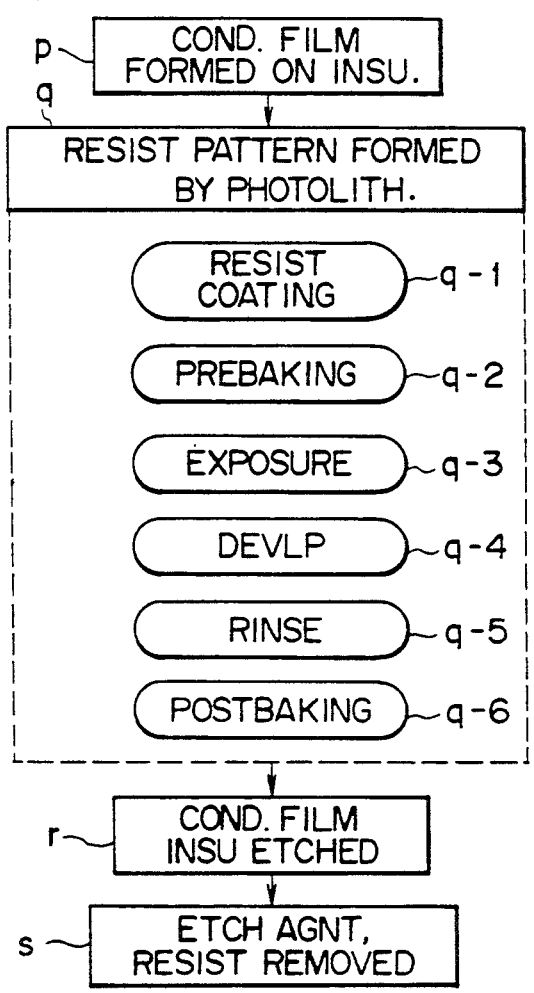
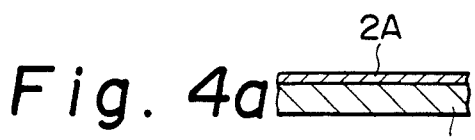
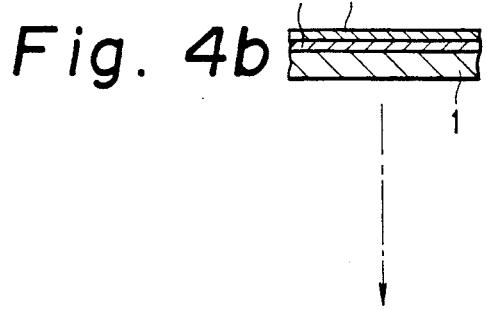
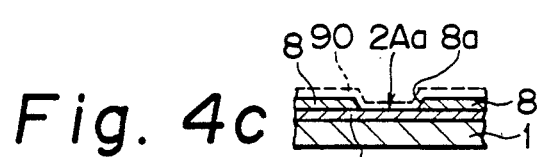
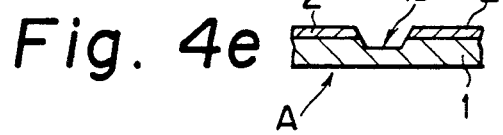

Fig. 5
- PATTERN FORMED BY COND. PRINT — e
- INSU. ETCHED — f
- ETCH AGNT REMOVED — g
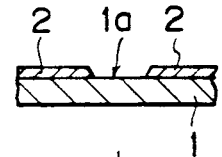
Fig. 6a
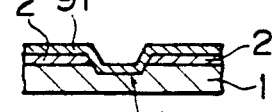
Fig. 6b
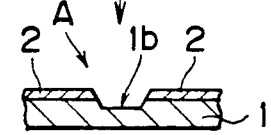
Fig. 6c
Fig. 7
- COND. FILM FORMED ON INSU. — h
- COND. PATTERN FORMED BY CUTTING MACHINE — i
- CHIPS REMOVED — j
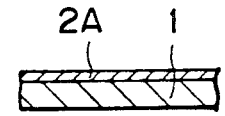
Fig. 8a
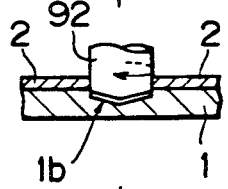
Fig. 8b
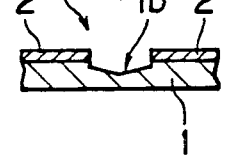
Fig. 8c

CONDUCTIVE PATTERN BOARD AND METHOD FOR PRODUCING THE SAME

BACKGROUND OF THE INVENTION

1. Field of the Invention

The present invention relates to a conductive pattern board and a method for producing the board which is preferably applied to a minute circuit board used for electronic devices such as a bar code display device or a fluorescent dot array device.

The present invention also relates to a conductive pattern connector comprising an insulative member on which conductive patterns are formed and a method for connecting the patterns.

The present invention further elates to an anisotropic conductive film for connecting conductive patterns with each other formed on an insulation member and a method for connecting the patterns.

2. Description of the Related Art

A conductive pattern board comprises an electric insulation member such as a glass substrate on which conductive patterns made from a conductive material such as Al, ITO or Ni are formed. Instead of the glass substrate, the insulation member may be composed of a ceramic member or a glass epoxy member on which conductive patterns made from Cu or Ni are formed. The materials and the patterning mode or layout of the patterns are determined according to the purpose and functional requirements of the pattern board device. Such conductive patterns are formed with a minute thin gap having a very narrow width interposed therebetween.

It has been required to obtain a pattern board device having a high integrated and high density minute pattern structure with high reliability in function. The minute patterns have become thinner according to progress in photolithography techniques.

However, the thinner the patterns are, the more possibility of problems of short circuit and leakage are involved, which causes a reduction in the functional reliability of the device.

Japanese Patent Application Laying Open (KOKAI) No. 58-108864 discloses a structure for connecting the patterns formed on an insulation member of the pattern board. The structure comprises a wire to connect two patterns on the board by a wire-bonding method. one pattern comprising a light emitting circuit segment, for example, and the other pattern comprising a driving circuit to be connected to the segment. The structure makes it possible to realize a small module unit.

However, after a long time of use when a part of the unit becomes unusable or the device malfunctions, the whole of the unit has to be exchanged.

Another structure for connecting the two patterns is such that an anisotropic conductive film is disposed between a connecting portion of one pattern (light emitting circuit segment, for example) and another connecting portion of the other pattern (driving circuit, for example) so that the connecting portions are electrically connected together in a state that the pattern connecting portions are arranged in a compressed air or gas. In accordance with this structure, it becomes possible to exchange only one of the patterns which has become defective after a long time of use, instead of exchanging the whole structure.

However, when the pressure of the compressed air or gas is excessively strong, the patterns and/or insulation member are damaged and cracks are generated therein. On the other hand, when the pressure is weak, the patterns are not reliably connected together.

Besides, the reliability of the connection between the patterns is further reduced when the anisotropic film is dislocated.

The anisotropic film comprises an insulation rubber as a basic material thereof. The film is subjected to a compressed atmosphere for a long time, which impairs the resiliency and flexibility of the rubber. Therefore, after a defective pattern is exchanged for a normal one, when the film is recompressed, the film does not reliably connect the patterns.

SUMMARY OF THE INVENTION

It is therefore an object of the present invention tc provide a conductive pattern board in which the problems of short circuit and leakage mentioned above are attenuated.

Another object of the present invention is to provide a conductive pattern connector which reliably connect: the patterns formed on the conductive pattern board.

The above-mentioned object of the present invention can be achieved by a conductive pattern board compris ing an insulation member on which conductive pattern are formed wherein a part of the insulation membe between the patterns is formed as a portion so that th substantial length of the insulation member between th patterns is elongated.

A method for producing the conductive patter board comprises: a step of forming a conductive film o: a surface of an insulation member; a step of removing part of the film to form a desirable conductive patter on the insulation member; a step of removing a part c the insulation member in the area where the film i removed to form a portion in the area, wherein the ste of removing the film and the step of removing the mem ber are conducted at the same time.

An advantage of the above-mentioned conductiv pattern board structure is that the electric leakage an short circuit are prevented, which increases the reliabi ity of the board even though the patterns are very thir since the insulation member between the patterns formed as a portion so that the length of the membe between the patterns is elongated.

An advantage of the method mentioned above is th; the conductive pattern board having the above-mer tioned structure can be easily produced efficiently in same process, since the film removing step and the inst lation removing step are simultaneously carried out.

The above-mentioned object of the invention can als be achieved by a conductive pattern board comprisin an insulation member and conductive patterns forme on the insulation member, each pattern having a coi necting portions, wherein a concave portion is forme in the insulation member in the vicinity of the connec ing portion.

The above-mentioned object of the invention can al: be achieved by a conductive pattern board comprising first conductive pattern connector which comprises ¿ insulation member and conductive patterns formed c the insulation member, each pattern having a connec ing portion, and a second conductive pattern connect( which comprises an insulation member and conducti\ patterns formed on the insulation member, each patte: having a connecting portion, wherein a concave portic is formed on the insulation member of at least one of tl connectors in the vicinity of the connecting portion of the pattern, wherein an adhesive agent is disposed in the concave portion, wherein the connecting portion of the first connector and the connecting portion of the second connector face with each other, and wherein an anisotropic conductive film is interposed between the first and second connectors to connect the connecting portions thereof together.

The connecting portion becomes relatively convex due to the concave portion of the insulation member in the vicinity thereof so that when the connecting portions are pressed to each other through the anisotropic conductive film interposed therebetween, the pressing force is concentrated to the connecting point, which makes it possible to reliably connect the portions.

Also, because of the adhesive agent arranged in the concave portion, the anisotropic film is bonded to the insulation member, which increases the reliability of connection between the portions.

Further, by arranging the structure in such a way that the adhesive agent is disposed in the concave portion of only one of the connectors, at the time of separating the connectors, the connectors are separated in the state wherein the anisotropic film is being bonded to one of the connectors to which the adhesive agent is arranged.

The object of the present invention mentioned before can be achieved by a conductive pattern board comprising an anisotropic conductive film in which the electric resistance in the direction of film thickness is lower than that in the direction of film surface, wherein one of the film surfaces is arranged to be adhesive.

The object of the present invention mentioned before can also be achieved by a conductive pattern board comprising a first conductive pattern connector which comprises an insulation member and a conductive patterns formed on the insulation member, each pattern having a connecting portion, and a second conductive pattern connector which comprises an insulation member and conductive patterns formed on the insulation member, each pattern having a connecting portion, the board further comprising an anisotropic conductive film in which the electric resistance in the direction of film thickness is lower than that in the direction of film surface wherein one of the film surfaces is arranged to be adhesive, wherein the connecting portion of the first connector and that of the second connector face each other so that the portions are electrically connected with each other through the anisotropic film interposed therebetween.

The connecting portions of the first and second connectors are pressed to each other through the anisotropic conductive film, one of which surfaces is arranged to be adhesive.

Therefore, it is an advantage of the above-mentioned structure of the board that the connecting portions are reliably connected together without dislocation of the anisotropic film with respect to the connecting portion.

Another advantage of the above-mentioned structure is that the connecting portions are separated from each other in the state that the anisotropic film is being bonded to the connector to which the adhesive side of the film is contacted.

Further objects and advantages of the present invention will be apparent from the following description of the preferred embodiments of the invention as illustrated in the accompanying drawings.

BRIEF DESCRIPTION OF THE DRAWINGS

FIG. 3 is a flow chart of another example of the process for producing the conductive pattern board in accordance with the present invention;

FIGS. 4a to 4e are sectional views of the pattern board in the producing process of FIG. 3 representing different steps in sequence in this order, respectively;

FIG. 5 is a flow chart of still another example of the process for producing the conductive pattern board in accordance with the present invention;

FIGS. 6a to 6c are sectional views of the pattern board in the producing process of FIG. 5 representing different steps in sequence in this order, respectively;

FIG. 7 is a flow chart of still another example of the process for producing the conductive pattern board in accordance with the present invention;

FIGS. 8a to 8c are sectional views of the pattern board in the producing process of FIG. 7 representing different steps in sequence in this order, respectively;

DESCRIPTION OF THE PREFERRED EMBODIMENTS

Embodiments of the present invention are described hereinafter in detail with reference to the drawings.

Figure 9:
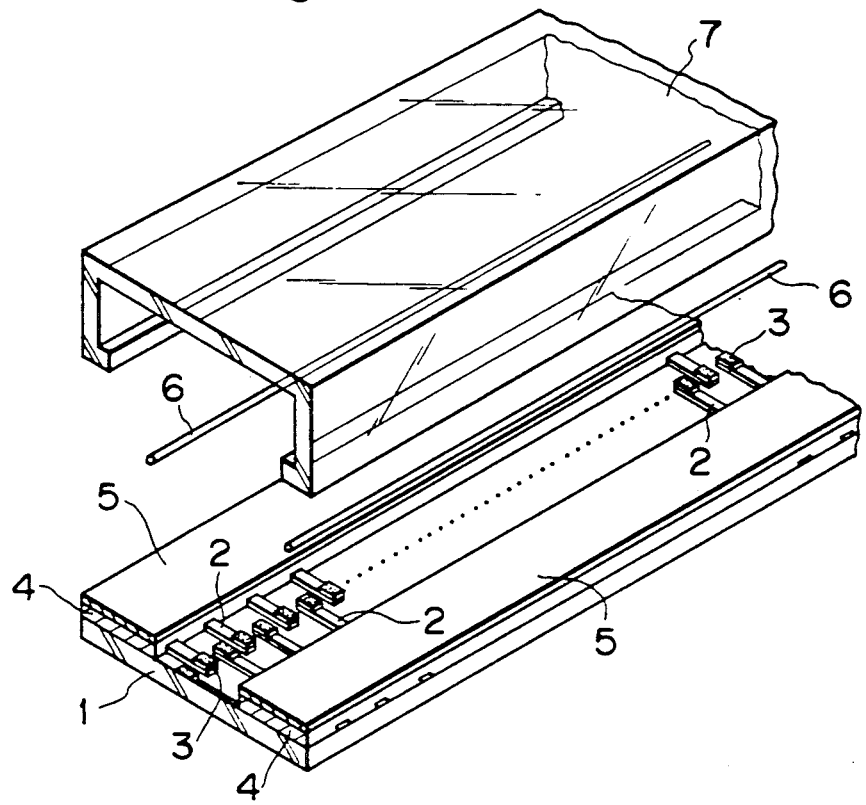
FIG. 9 is an explosive perspective view of a fluorescent dot array device to which the conductive pattern board of the present invention is applied.
Figure 10:
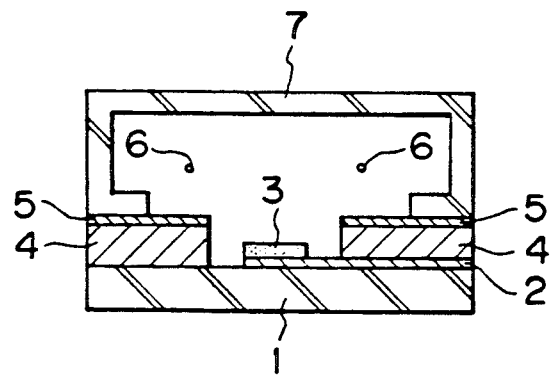
FIG. 10 is a sectional view of the device of FIG. 9.

First, a fluorescent dot array device is described as an example of the device to which the present invention is applied, with reference to FIGS. 9 and 10.

In the drawings, numeral 1 designates an electric insulation member made form glass, ceramic or resin. The member 1 has a plurality of conductive patterns 2 disposed in series thereon along the longitudinal direction thereof. Each pattern 2 has a fluorescent portion 3 at an end thereof. The actual patterns 2 and the portions 3 are very thin and minute. However, the illustration is exaggeratedly enlarged for the sake of easy understanding. The portions 3 are arranged in a line aligning with the longitudinal center line of the member 1. Insulation layers 4, 4 are formed in both sides of the row of portions 3 on the member 1. A grid electrode 5 is formed on each of the layers 4, 4. Tungsten wires 6, 6 are arranged above the member 1 along the longitudinal direction thereof as hot cathodes of the device. A face cover 7 is secured to the member 1 through the layer 4. The cover 7 is made form a transparent material such as glass.

The member 1, the layers 4, 4, the electrodes 5, 5 and the cover 7 constitute an enclosed space therein which is highly evacuated to form a high vacuum chamber. The patterns 2, the portions 3 and the wires 6 are disposed within this sealingly enclosed space.

An embodiment of the conductive pattern board and the process for producing the board in accordance with the present invention is described hereinafter with reference to FIGS. 1 and 2.

Figure 2A:
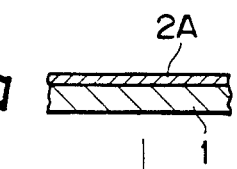
FIGS. 2a to 2f are sectional views of the pattern board in the producing process thereof representing different steps in sequence in this order, respectively.
Figure 2B:
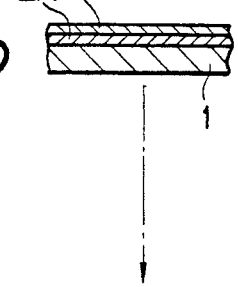
Figure 2C:
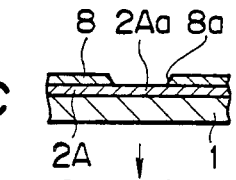

In a step (a) of forming a conductive film on the insulation member, a conductive film 24 is formed on an electric insulation member 1 by an appropriate means such as a sputtering method or a vacuum evaporation method over the entire upper surface of the member 1 (FIG. 2a). The member 1 is made from glass, ceramic or plastic. The material of the film 2A is, for example, Al, Ni, Cr, or Au.

The conductive patterns are formed by a photolithographic process (b). This process (b) comprises: a step (b-1) of coating the film 2A on the member 1 with a photoresist film 8 (FIG. 2b); a step (b-2) of prebaking the film 8; a step (b-3) of exposing the film 8 through a pattern mask for making a latent pattern image on the film 8; a step (b-4) of developing the latent pattern on the film 8 to form a slit 8a therein according to the pattern to expose a part 2Aa of the film 2A (FIG. 2c); a step (b-5) of rinsing away the resist film on the developed part 2Aa; a step (b-6) of postbaking the resist film 8 remaining after the rinse step (b-5); a step (b-7) of etching the conductive film 2A by applying an etching agent to the part 2Aa of the film 2A to expose a part 1a of the insulation member 1 (FIG. 2d); and a step (b-8) of rinsing away the conductive film remaining in the etched portion. The desired patterns 2, 2 are formed in the etching step (b-7).

Figure 2D:
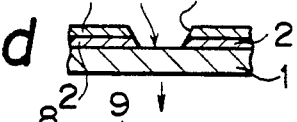
Figure 2E:
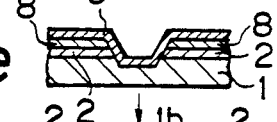

After that, the film stacked board treated as mentioned above is subjected to an insulation etching step (c). In this step (c), the board is supplied with an etching agent 9 (FIG. 2e), which agent dissolves or erodes the member 1 so that a recess 1b (FIG. 2f) is formed in the member 1 at the exposed portion 1a of the member 1 (FIG. 2d).

Figure 2F:
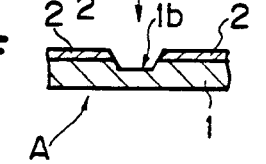

After that, the etching agent 9 and the resist film 8 are removed (step (d))(, so that patterns 2, 2 are formed on the member 1 with the recess 1b being interposed between the patterns 2, 2, as illustrated in FIG. 2f.

The etching agent 9 for etching the member 1 is selected according to the material of the member 1. For example, when the member 1 is made form glass, a fluoric erosive ink is coated on the glass for about 60 seconds, thereby a recess 1b of about 3 μm deep is formed in the glass. It is possible to form a recess of 10 μm deep by changing the condition. When the member 1 is made from sodalime glass, the inside of the recess becomes rough as a frosted glass which is optically opaque. Whereas, when the member 1 is made from borosilicate glass, the etching surface is relatively smooth so that the transparency thereof is high compared with that of the sodalime glass. Therefore, the insulation material and the etching agent can be selected considering the purpose of the pattern board A.

A method for producing the conductive pattern board in accordance with the present invention and the pattern board produced by the method are described hereinafter with reference to FIGS. 3 and 4.

First, in step (p), a conductive film 2A is formed on an insulation member 1 (FIG. 4a). Then, in step (q), resist patterns are formed on the film 2A by a photolithographic process. This process (q) is substantially the same as the process for the steps (b-1) to (b-6) of FIG. 1 mentioned above, which steps correspond to steps (q-1 to (q-6), respectively. In this process (q), a resist film 8 is coated on the film 2A (FIG. 4b) and a part of the film 8 is removed to expose a part 2Aa of the film 2A.

After that, in step (r), an etching agent 90 is applied to the film stacked board treated as mentioned above (FIG. 4c). The agent 90 is composed of an acid solution which dissolves or erodes the film 2A and the member 1 but does not dissolve the film 8. Due to the action of the agent 90, a part of the film 2A and a part of the member 1 as well are removed at the same time in this step (r) at the exposed portion 2Aa where the film 8 is removed. Thereby, conductive patterns 2, 2 and a recess 1b are formed, as illustrated in FIG. 4d.

After that, in step (s), the agent 90 and the film 8 are removed so that a conductive pattern board A having patterns 2, 2 with the recess 1b disposed therebetween is obtained (FIG. 4e).

The agent 90 is selected considering the materials of the member 1 and the film 2A. For example, when the film 2A is made from Al, Cu, or Ni, the agent 90 is selected from a hydrofluoric acid solution, a nitric acid solution, a hydrochloric acid solution, or an acetic acid solution. It is desirable to select a combination of materials of Al, glass and the hydrofluoric acid solution from the stand point of manufacturing cost.

In accordance with the producing method mentioned above, it becomes possible to efficiently carry out the cleaning step and the drying step after removing the etching agent and the resist film, since the conductive film and the insulation member are etched simultaneously in the same step.

Another embodiment of the method for producing the conductive pattern board in accordance with the present invention is described hereinafter with reference to FIGS. 5 and 6.

First, in step (e), a conductive paste 2 is printed on an insulation member 1 to directly form patterns 2, 2 on the member 1. A part 1a of the member 1 is exposed between the patterns 2, 2, as illustrated in FIG. 6a.

After that, in step (f), an etching agent 91 is applied over the patterns 2, 2 including the exposed portions 1a of the member 1 (FIG. 6b). The patterns 2, 2 function as a mask for the etching agent 91. Thereby, the member 1 in the portion 1a is etched to form a recess 1b therein.

Figure 1:
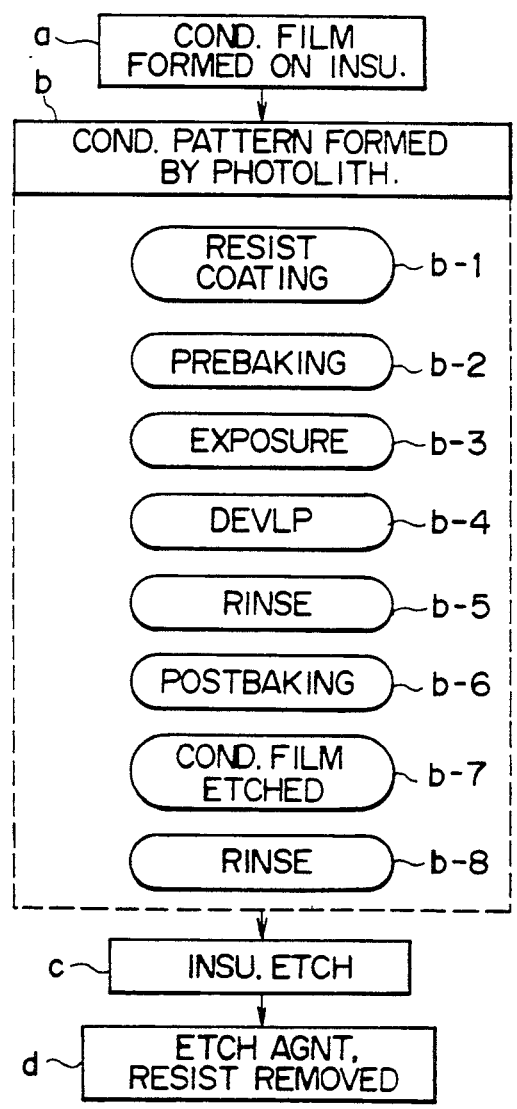
FIG. 1 is a flow chart of an example of the process for producing the conductive pattern board in accordance with the present invention.

The agent 91 is selected according to the material of the member 1 and the etching condition such as time, as explained referring to FIG. 1. After a predetermined time has passed, in step (g), the agent 91 is removed, so that a conductive pattern board A having patterns 2, 2 thereon with the recess 1b formed therebetween is obtained, as illustrated in FIG. 6c.

A still further embodiment of the method for producing the conductive pattern board in accordance with the present invention is described hereinafter with reference to FIGS. 7 and 8.

In this embodiment, the recess is mechanically formed in the insulation member, instead of being formed by the photolithographic method as in the case of FIGS. 3 and 4 mentioned before.

First, in step (h), a conductive film 2A is formed on an insulation member 1 (FIG. 8a). After that, in step (i), the film 2A and member 1 are cut by a cutting machine 92 to form patterns 2, 2 and a recess 1b in the member 1. The machine 92 is moved in the direction perpendicular to the drawing to cut the film 2A and the member 1 (FIG. 8b). After that, in step (j), cutting chips and cutting oil are removed so that a conductive pattern board A having patterns 2, 2 formed thereon with the recess 1b formed therebetween is obtained.

The patterns 2, 2 and the recess 1b may be formed by means of a laser beam to melt the film 2A and the member 1 at the same time, instead of the cutting machine 92 mentioned above.

In accordance with the above-mentioned methods, the inside surface of the recess is rough. By coating the inside surface with resin, it becomes possible to prevent moisture, dust or other undesirable particles from attaching to the surface so that the short circuit and leakage of the pattern board are reliably avoided.

With regard to the depth of the recess 1b, the deeper the recess is, the better from the stand point of preventing the short circuit since the length between the patterns along the insulation member surface is elongated. However, the depth of the recess has to be determined considering the strength of the member 1 as well.

On the pattern 2, the fluorescent portion 3 (FIGS. 9 and 10) is formed by an appropriate method such as an electrophoretic method.

The conductive pattern board of the present invention can be applied to various integrated circuit devices other than the fluorescent dot array mentioned above.

Figure 11:
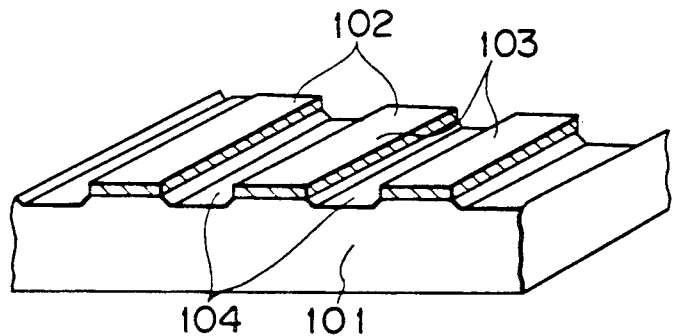
FIG. 11 is a perspective view of another embodiment of the present invention.

Another embodiment of the present invention is described hereinafter with reference to FIGS. 11 and 12.

A plate of insulation member 101 is made from glass, ceramic, or resin. A plurality of conductive patterns 102 are formed on the member 101. A part of each pattern 102 constitutes a connecting portion 103. Concave portions 104 are formed in the member 101 in the vicinity of the portion 103.

Figure 12:
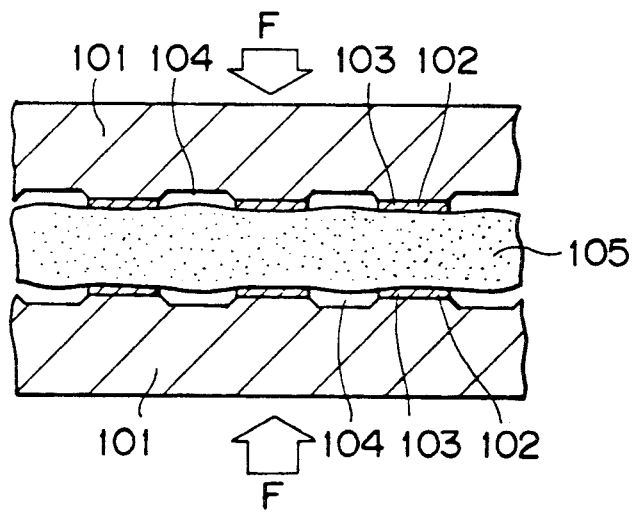
FIG. 12 is a sectional view of the embodiment of FIG. 11 for explaining the state of electrical connection within the structure.

Two of the above-mentioned members 101 are arranged in such a way that the portions 103 face each other with an anisotropic conductive film 105 interposed therebetween, as illustrated in FIG. 12, so that the opposed portions 103 are connected together. In this arrangement, since the concave portions 104 are formed in the vicinity of the connecting portions 103, the portions 103 constitute convex portions in relation to the portions 104. Therefore, when a force F is applied from behind the member 1, as illustrated in FIG. 12, the force is concentrated to the convex portions 103 so that the portions 103 are reliably connected together. Besides, it becomes unnecessary to apply a strong force to tightly contact the portions 103 with each other, which results in that damages of the member 101 and the patterns 102 due to the force are avoided and that cracks do not appear in the member 101 or patterns 102.

Figure 13:
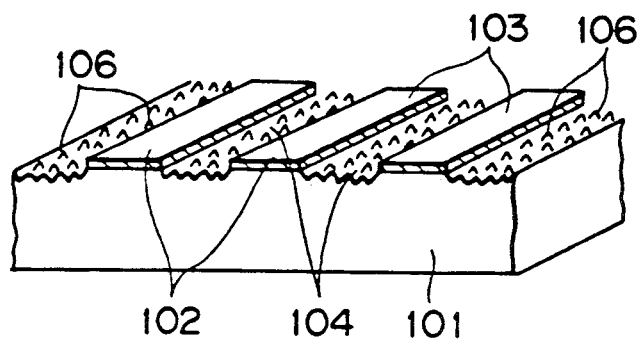
FIG. 13 is a perspective view of still another embodiment of the present invention.

A further embodiment of the present invention is described hereinafter with reference to FIG. 13. The same or corresponding parts as the embodiment of FIGS. 11 and 12 are designated by the same reference numerals.

A plate of insulation member 101 has a plurality of conductive patterns 102 formed thereon. A part of the pattern 102 constitutes an electric connecting portion 103. Also, concave or sunk portions 104 are formed on the surface of the member 101 in the vicinity of the portions 103. A number of small projections 106 are formed in each of the portions 104.

Two of the members 101 are combined together in such a way that the portions 103 face each other through an anisotropic conductive film 105 so as to electrically contact the portions 103 with each other. As in the case of FIG. 12, when a force F is applied to the member 101 from behind thereof, the force is concentrated to the convex portions 103 so that the portions 103 are reliably connected together. Also, due to the arrangement of the small projections 106 in the portions 104, a frictional force is generated between the film 105 and the projections 106, which prevents dislocation of the film 105 from the portions 103 so that the reliability of connection is further increased.

Figure 14:
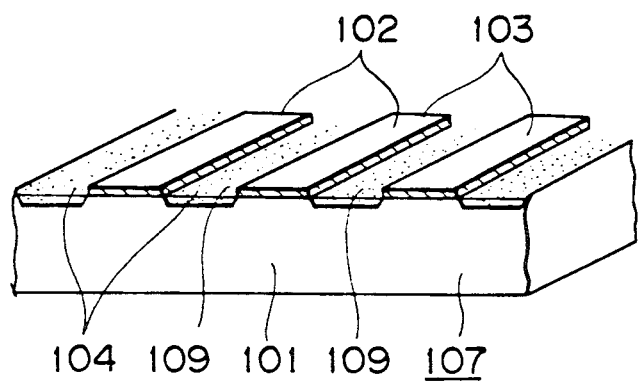
FIG. 14 is a perspective view of a further embodiment of the present invention.
Figure 15:
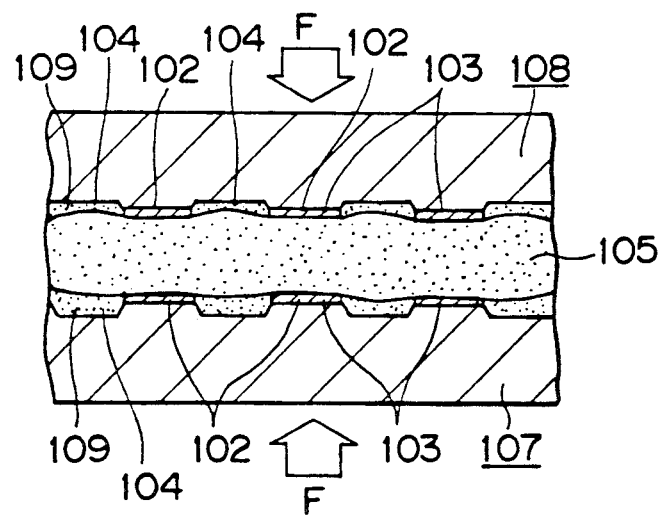
FIG. 15 is a sectional view of the embodiment of FIG. 14 for explaining the state of electrical connection within the structure.

A still further embodiment of the present invention is described hereinafter with reference to FIGS. 14 and 15.

A first conductive pattern connector element (pattern board) 107 comprises a plate of insulation member 101 and conductive patterns 102 formed on the member 101. Also, a second conductive pattern connector element (pattern board) 108 is similarly prepared. A part of the pattern 102 of each of the connector elements 107 and 10-8 constitutes an electric connecting portion 103.

Recess or sunk portions 104 are formed on the surface of the member 101 in the vicinity of the portions 103. In each portion 104, an adhesive agent 109 is disposed.

The first and second connector elements 107 and 108 face each other in such a way that the connecting portions 103 face each other through an anisotropic conductive film 105 interposed therebetween. A force F is applied to the member 101 from behind thereof, as illustrated in FIG. 15, so that the opposed connecting portions 103 are connected with each other.

In this case, the force F is concentrated to the convex portions 103 so that the portions 103 are reliably connected to each other. Also, due to the adhesive agent 109, the film 105 is secured to the recess portions 104 of the connector elements 107 and 108, which further increases the reliability of connection of the portions 103.

As the agent 109, a material which effectively matches with the film 105 and the member 101 is selected. The agent 109 is preferably composed of a material having a resin base of the same group as the film 105 and the member 101.

When the connector element 107 and 108 are to be detachably connected together, a material of relatively weak adhesiveness is selected as the agent 109. Whereas, when the elements 107 and 108 are to be semi-permanently connected together, a material of strong adhesiveness is selected as the agent 109.

Figure 16:
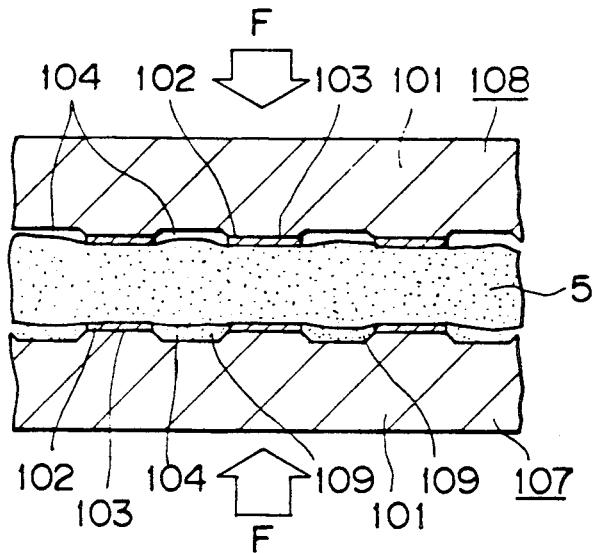
FIG. 16 is a sectional view of a further embodiment of the present invention for explaining the state of electrical connection within the structure thereof.

A still further embodiment of the present invention is described hereinafter with reference to FIG. 16.

In this embodiment, the adhesive agent 109 is disposed only in the recess portions 104 of the first connector element 107. The second connector element 108 has no adhesive agent 109 contained therein.

The first and second connector elements 107 and 108 face each other in such a way that the connecting portions 103 face each other through an anisotropic conductive film 105 interposed therebetween. A force F is applied to the member 101 from behind thereof, as illustrated in FIG. 16, so that the opposed connecting portions 103 are connected with each other.

In this case, the force F is concentrated to the convex portions 103 so that the portions 103 are reliably connected to each other.

Also, when the elements 107 and 108 are separated, the film 105 is being attached to the first element 107 to which the agent 109 is applied. Therefore, it is desirable to arrange in such away that the first element 107 is used in the side which has to be more often renewed than the second element 108 so that the used element 107 is disposed of with the film 105 which is desirably renewed after a long time of use since the resiliency thereof is degraded due to the pressure applied to the device in which the connector elements are installed.

Figure 17:
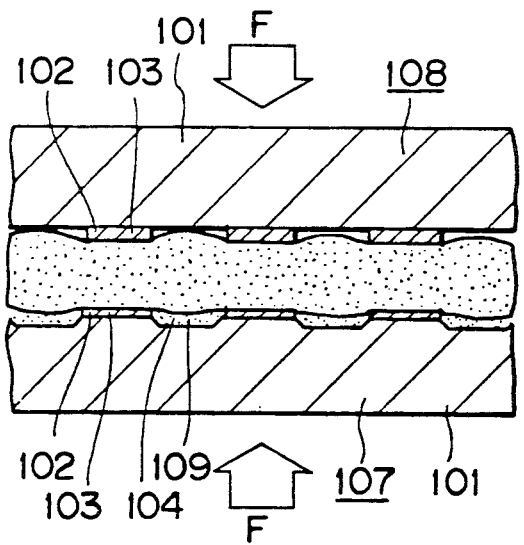
FIG. 17 is a sectional view of a further embodiment of the present invention for explaining the state of electrical connection within the structure thereof.

A still further embodiment of the present invention is described hereinafter with reference to FIG. 17.

In this embodiment, the second connector element 108 has patterns 102 which are thick so that the element 108 is provided with no recess portions formed therein. On the other hand, the first element 107 has recess portions 104 formed therein in each of which portions 104 an adhesive agent 109 is arranged.

The first and second elements 107 and 108 face each other in such a way that the portions 103 face each other through the film 105 interposed therebetween. A force F is applied to each member 101 from behind thereof, as illustrated in FIG. 17, so that the opposed portions 103 are connected together.

By sufficiently thickening the patterns 102 of the element 108, the patterns 102 form convex portions projected from the insulation member surface without forming the recess between the patterns. Therefore, the force F is concentrated to the connecting portions 103 of the patterns 102 so that the portions 103 are reliably connected to each other.

As mentioned above, in accordance with the embodiments of the present invention, conductive patterns each having a connecting portion are formed on the surface of an insulation member wherein recess portions are formed in the member in the vicinity of the connecting portions. Therefore, each of the connecting portions forms a convex portion projected form the insulation surface. Accordingly, when the connecting portions face each other through an anisotropic film interposed therebetween and are forced to press against each other, the pressing force is concentrated to the convex connecting portions so that the portions are reliably connected together.

Also, by arranging an adhesive agent is the recess, the anisotropic film can be securely bonded to the insulation member, which further increases the reliability of connections.

Also, by arranging the adhesive agent only in one of the connector elements which are to be coupled together, it becomes possible to change only one of the elements which has become defective after a long time of use. Besides, by arranging in such a way that the adhesive agent is applied to the connector element which is to be renewed more often after a long time of use than the other element to be coupled together, it becomes possible to dispose of and renew the element which has become defective with the conductor film which has also become defective due to the state of being compressed for a long time.

Figure 18:
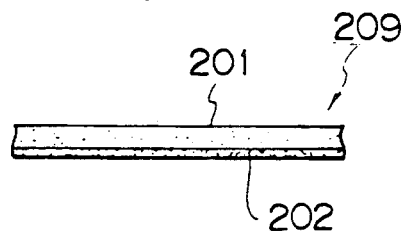
FIG. 18 is a side view of an embodiment of the present invention.

A still further embodiment of the present invention is described hereinafter with reference to FIG. 18.

An anisotropic conductive member 102 has a characteristic of such that the electric resistance in the direction of thickness thereof is lower than that in the direction of surface thereof. The member 201 comprises an electric insulation rubber as a base material which contains electric conductive materials such as metal particles, metal filaments, carbon particles, carbon filaments or conductive rubber. One of the surfaces of the member 201 is coated with an adhesive agent 202. Note that the agent 202 comprises a material of the same group of the base material of the member 201 or a material which does not impair the characteristics of the rubber. The member 201 and the agent 202 constitute an anisotropic conductive film 209.

Two conductive pattern connector elements (not shown) face each other through the film 209 interposed therebetween. The elements are pressed to each other so that the two elements are electrically connected. In this case, due to the agent 202 disposed on one of the surfaces of the film 209, the element in the side of the agent is securely bonded to the film 209 even when the pressing force is released, which prevents the element from being moved and dislocated.

Figure 19:
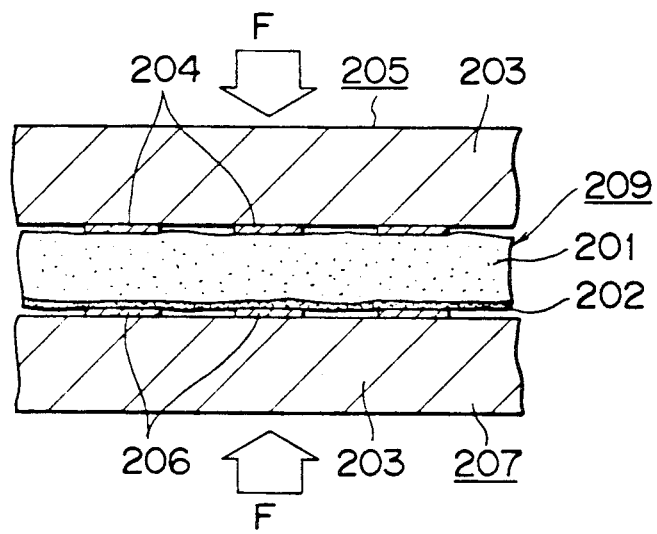
FIG. 19 is a sectional view of a further embodiment of the present invention.
Figure 20:
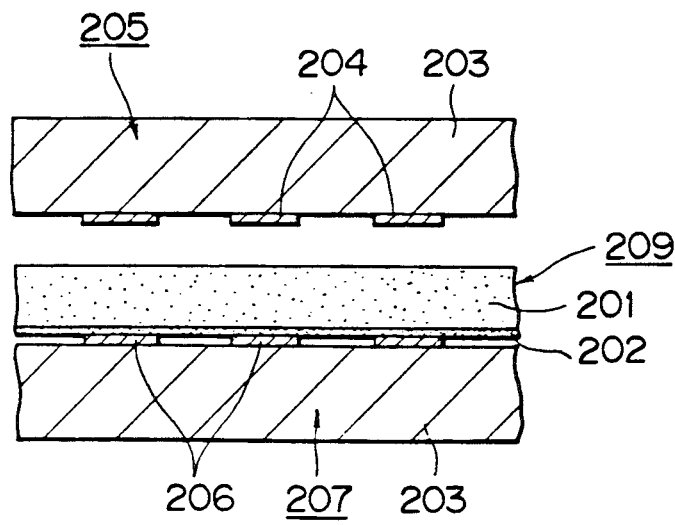
FIG. 20 is a sectional view of the embodiment of FIG. 19 in a state that a conductive pattern connector is separated from the assembled structure of FIG. 19.
Figure 21:
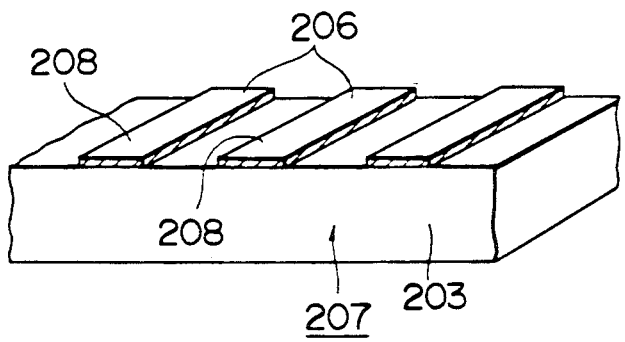
FIG. 21 is a perspective view of the conductive pattern connector of the embodiment of FIG. 19.

A still further embodiment of the present invention is described hereinafter with reference to FIGS. 19 to 21.

A first conductive pattern connector element 205 comprises a plate shaped electric insulation member 203 on which a plurality of conductive patterns 204 are formed. Also a second conductive pattern connector element 207 comprises a plate shaped electric insulation member 203 on which a plurality of conductive patterns 206 are formed. A part of each of the patterns 204 and 206 constitutes an electric connecting portion 208.

The first and second elements 205 and 207 face each other in such a way that the portions 208 of the element 205 and 207 face each other through an anisotropic conductive film 209 interposed therebetween. The film 209 comprises an anisotropic conductive member 201 one of which surfaces is coated with an adhesive agent 202. The two elements 205 and 207 are pressed to each other by a force F from behind each element to electrically connect the portions 208 of the patterns 204 and 206. The film 209 is bonded to each portion 208 of the pattern 206 by the agent 202.

Since one of the surfaces of the film 209 is bonded to the pattern 206 through the agent 202, the film 209 is fixedly held between the patterns 204 and 206 without being dislocated therefrom so that the portions 208 of the patterns 204 and 206 are reliably connected together electrically.

On the other hand, when the elements 205 and 207 are to be separated, the elements are separated in a state that the film 209 is being bonded to the patterns 206 of the element 207. Therefore, it is desirable to arrange the elements 205 and 207 in such a way that the element 207 comprises patterns 206 which are apt to be more easily damaged or become defective after a long time of use and have to be more often renewed than the patterns 204 of the element 205, so that the used element 207 is disposed of with the film 209 and renewed along with the film 209. It is desirable, for the sake of upgrading the quality of the device to which the pattern elements are applied, to renew the film 209 with the element 207 since the film 20-9 is deformed and the resiliency thereof is impaired due to the pressure to which the film 209 has been subjected for a long time.

An example of the application of the conductive patterns is an arrangement that the patterns 204 are used as a driving circuit of a fluorescent dot array device and the patterns 206 are used as the light emitting segments of he device. The light emitting segments are apt to be damaged or become defective after a long time of use compared to the driving circuit of the device. Therefore, it is desirable to renew the connector element 207 which comprises the light emitting segments along with the film 209 by separating the element 207 with the film 209 from the element 205, as illustrated in FIG. 20.

Figure 24:
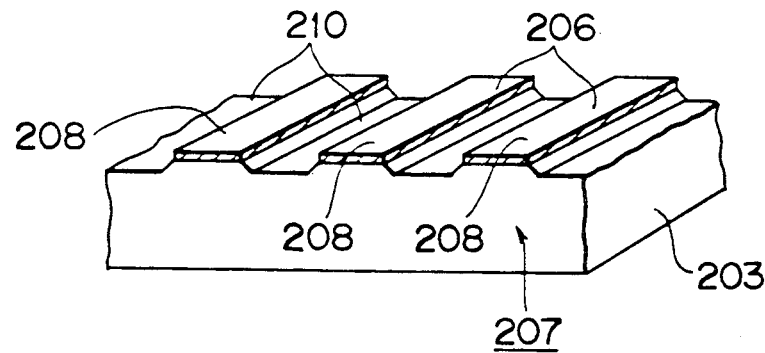
FIG. 24 is a perspective view of the conductive pattern connector of the embodiment of FIG. 22.

A still further embodiment of the present invention is described hereinafter with reference to FIGS. 22 and 24.

Recess portions 210 are formed on the insulation member 203 between the patterns 204, 206 in the vicinity of the connecting portions 208 of the patterns. As in the case of he embodiment of FIGS. 19 to 21, an anisotropic film 209 is interposed between the connecter elements 205 and 207 to which a force F is applied from behind each element to electrically connect the connecting portions 208 of the patterns 204 and 206 with each other through the film 209. One of the surfaces of the film 209 is covered with an adhesive agent 202. The agent 202 is arranged to face the element 205 side so that the film 209 is bonded to the connecting portions 208 of the patterns 204.

Figure 22:
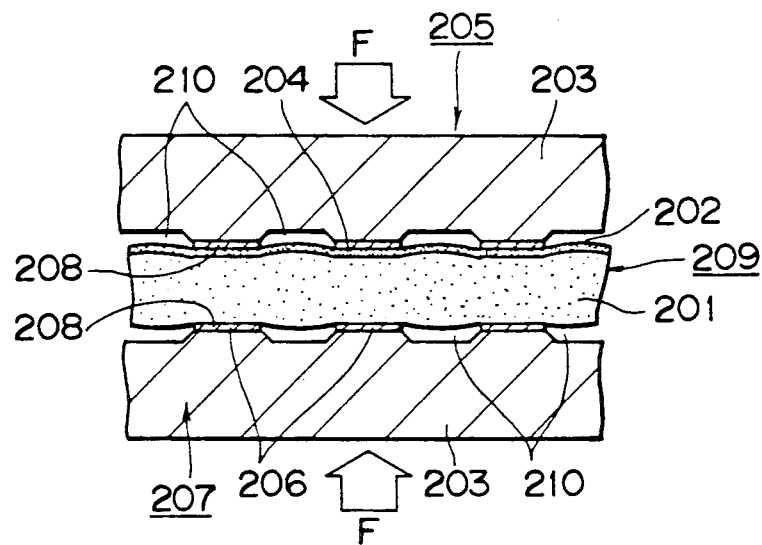
FIG. 22 is a sectional view of a further embodiment of the present invention.

In accordance with the structure mentioned above, when the members 203 are pressed to each other from behind each member with a force F, as illustrated in FIG. 22, the force F is concentrated to the convex connecting portions 208 of the patterns 204 and 206 so that the opposed portions 208 are reliably connected to each other electrically.

Figure 23:
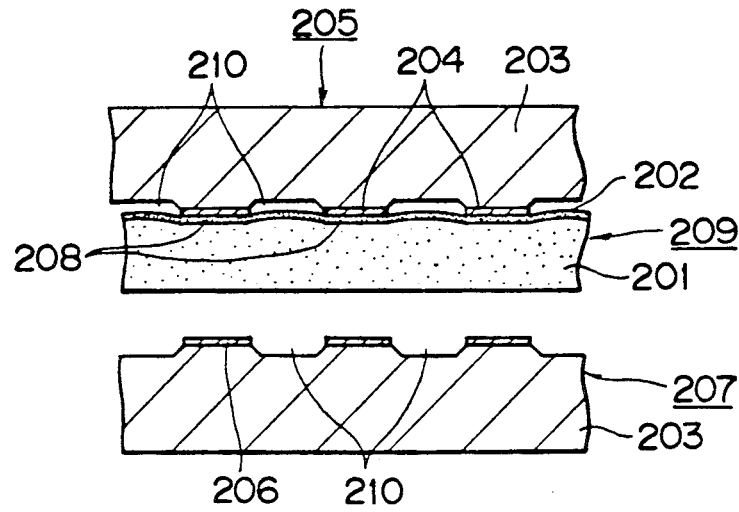
FIG. 23 is a sectional view of the embodiment of FIG. 22 in a state that a conductive pattern connector is separated from the assembled structure of FIG. 22.

On the other hand, when the elements 205 and 207 are to be separated, the element 207 is removed from the element 205 in the state that the film 209 is being bonded to the portions 208 of the patterns 204 of the element 205, as illustrated in FIG. 23.

As mentioned before, the patterns 204 constitute the drive circuit of he fluorescent dot array device and the other patterns 206 constitute the light emitting segments of the device. By this arrangement, it becomes possible to efficiently check or test the plurality of segments at the same time with the use of one drive circuit. When the film 209 is deformed after repetition of operation of the device due to the pressure applied to the film in each operations, the deformed film 209 is removed from the drive circuit and substituted by a new film. For this purpose, it is desirable not to too strongly bond the film to the drive circuit.

A still further embodiment of the present invention is described hereinafter with reference to FIGS. 25 and 26.

In this embodiment, recess portions 210 are formed on the insulation member 203 between the pattern 204, 206 in the vicinity of the connection portions 208 of the patterns. Also, a number of small projections 211 are formed in the recess 210. Two conductive pattern connector elements 205 and 207 face each other in such a way that the connecting portions 208 of the patterns 204 and 206 face each other through an anisotropic conductive film 209 interposed therebetween. The film 209 has an adhesive agent layer 202 coated on one of the surfaces thereof.

Figure 25:
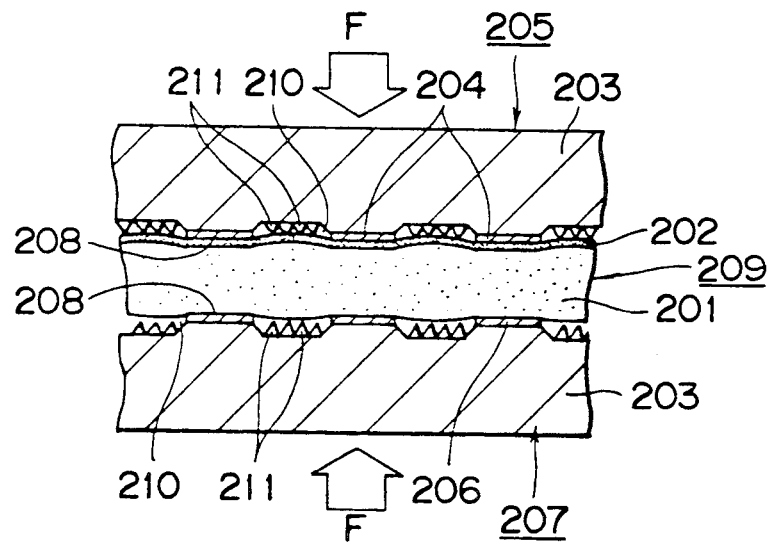
FIG. 25 is a sectional view of a still further embodiment of the present invention.
Figure 26:
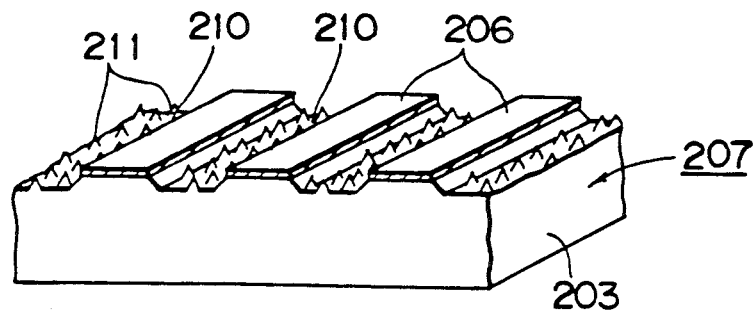
FIG. 26 is a perspective view of the conductive pattern connector of the embodiment of FIG. 25.

The elements 205 and 207 are pressed to each other from behind each member 203 thereof with a force F, as illustrated in FIG. 25, so that the portions 208 of the patterns 204 and 206 are electrically connected to each other and that the film 209 is bonded to the connecting portion 208 of the pattern 204 of the element 205.

In accordance with the above-mentioned structure, when the members 203 are pressed to each other from behind each member, the pressing force is concentrated to the convex connecting portions 208 so that the opposed portions 20-8 are reliably connected to each other electrically through the film 209. Besides, the film 209 comes in contact with the tips of the projections 211 so that frictional forces are generated between the projections 211 and the film 209, which presents the film 209 from moving, whereby increasing the reliability of electrical connection between the opposed portions 208.

As mentioned above, in accordance with the embodiments of the present invention, one of the surfaces of the anisotropic conductive film is coated with an adhesive layer so that, when the connecting portions of he conductive patterns face each other through the film and pressed to each other, the connecting portion of the pattern is bonded to the adhesive layer of the film so that the connecting portions of the patterns are reliably connected to each other through the film.

Also, when the connector elements are to be separated, one of the elements is removed from the other in the state that the film is being bonded to one of the elements. Therefore, it is possible to arrange the elements to be coupled together in such a way that the adhesive layer of the film faces to one of the elements which is apt to be damaged and become defective after a long time of use compared to the other element so that the used element is renewed along with the used film which has also become defective after a long time of use. Therefore, the reliability of connection between the elements after renewal of one of them is increased.

Many widely different embodiments of the present invention may be constructed without departing from the spirit and scope of the present invention. It should be understood that the present invention is not limited to the specific embodiments described in the specification, except as defined in the appended claims.

What is claimed is:

1. A conductive pattern board comprising:
    an electric insulation member;
    a plurality of recesses formed on a first surface of said insulation member; and
    an electric conductive pattern formed on each of portions of the first surface of said electric insulation member, each of the portions being located between two adjacent recesses.

2. A conductive pattern board according to claim 1, wherein said insulation member is made of a material selected from the group consisting glass, ceramic, and plastic.

3. A conductive pattern board according to claim 2, wherein said insulation member is made from glass and wherein said recess has a frosted inside surface which is optically opaque by etching said glass.

4. A conductive pattern board according to claim 2, wherein said insulation member is made from glass and wherein said recess has a smooth inside surface which is transparent by etching said glass.

5. A conductive pattern board according to claim 1, wherein a smooth resin coating layer is formed on an inside surface of said recess.

6. A connection structure comprising two conductive pattern boards according to claim 1, wherein said boards are faced to each other so that a portion of said pattern of one of said boards is faced to and electrically connected to a portion of said pattern of the other of said boards.

7. A connection structure according to claim 6, wherein the structure comprises:
 a first conductive pattern connector element composed of said conductive pattern board;
 a second conductive pattern connector element composed of said conductive pattern board;
 an adhesive agent disposed in said recess of at least one of said first and second conductive pattern connector elements; and
 an electric conductive film interposed between said portions of the patterns to be electrically connected together.

8. A connection structure according to claim 7, wherein said conductive film is composed of an anisotropic conductive film.

9. A connection structure according to claim 6, in which a plurality of projections are formed in each of said recesses.

10. A connection structure according to claim 7, wherein said adhesive agent is disposed only in one of said first and second conductive pattern connector elements.

11. A connection structure according to claim 6, wherein an anisotropic conducive film is interposed between said two conductive pattern boards to be coupled together.

* * * * *